(12) United States Patent
Weiss

(10) Patent No.: US 6,452,503 B1
(45) Date of Patent: Sep. 17, 2002

(54) SEMICONDUCTOR WAFER IMAGING SYSTEM

(75) Inventor: Mitchell Weiss, Carlisle, MA (US)

(73) Assignee: PRI Automation, Inc., Billerica, MA (US)

(*) Notice: Subject to any disclaimer, the term of this patent is extended or adjusted under 35 U.S.C. 154(b) by 0 days.

(21) Appl. No.: 09/809,598

(22) Filed: Mar. 15, 2001

(51) Int. Cl.$^7$ ................................................ G08B 21/00
(52) U.S. Cl. ...................... 340/673; 340/686.5; 414/935
(58) Field of Search ................................ 340/673, 674, 340/568.1, 686.5, 686.4, 686.2; 250/559.29, 559.3, 559.33, 559.36; 414/935, 936, 941

(56) References Cited

U.S. PATENT DOCUMENTS

| | | | | |
|---|---|---|---|---|
| 5,225,691 A | * | 7/1993 | Powers et al. | 250/559.4 |
| 5,308,993 A | * | 5/1994 | Holman et al. | 250/559.4 |
| 6,147,356 A | * | 11/2000 | Hahn et al. | 250/559.29 |
| 6,188,323 B1 | * | 2/2001 | Rosenquist et al. | 340/686.5 |

FOREIGN PATENT DOCUMENTS

| | | | |
|---|---|---|---|
| JP | 53543 | * | 3/1991 |
| JP | 163847 | * | 7/1991 |
| JP | 133445 | * | 5/1992 |
| JP | 294354 | * | 11/1998 |
| JP | 252335 | * | 9/2000 |
| JP | 15580 | * | 1/2001 |

* cited by examiner

Primary Examiner—Thomas Mullen
(74) Attorney, Agent, or Firm—Weingarten, Schurgin, Gagnebin & Lebovici LLP

(57) ABSTRACT

A wafer imaging system is provided in which a camera is mounted at a known position in relation to an open front of a cassette to view the cassette and its entire stack of wafer contents. The camera can be mounted on a robot or on a tool. An image of the set of wafers is captured and is image processed to provide information on the position and alignment of each wafer in the cassette. The image can be processed to provide data on separation of the wafers within the cassette, any cross slotting of wafers, and the center point of each of the wafers. Image analysis and processing is employed to determine the edge of each of the wafers. One image scan provides a determination of all information on the X, Y and Z position of the wafers in relation to the camera reference position.

7 Claims, 3 Drawing Sheets

SEMICONDUCTOR WAFER IMAGING SYSTEM

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Semiconductor wafers are usually contained in slots within a cassette holder. The wafers are stacked in spaced parallel arrangement and are usually scanned with a laser scanner to determine the alignment of the wafers within the cassette and to determine the center of the wafer so that each wafer can be appropriately grasped by a tool for proper removal of the wafer from the cassette and movement to an intended station. The scanner is aligned along the plane and moved vertically from wafer to wafer to provide a scan of all of the wafers within a cassette. This scanning procedure takes a relatively long time to traverse an entire stack of wafers, typically 25 wafers in a standard cassette. In addition, the determination of the wafer center for proper positioning on a tool is conventionally accomplished by separate alignment apparatus.

It would be helpful to have a simplified system for determining whether wafers are properly aligned within a cassette and at which slot locations they are within a cassette.

BRIEF SUMMARY OF THE INVENTION

In accordance with the present invention an imaging system is provided in which a camera or other image sensor is mounted at a known position in relation to an open front of a cassette to view at one time an entire stack of wafers in the cassette. The camera can be mounted on a robot or on a tool. An image of the set of wafers is captured and is image processed to provide information on the presence, position and alignment of each wafer in the cassette. The image can be processed to provide data on separation of wafers within the cassette, any cross slotting of wafers, the center point of each of the wafers and whether any wafers are missing.

The camera may be a video camera of digital or analog type, and may have a solid state image detector or image detection tube such as a vidicon tube.

The wafers can be illuminated by light which may take many different forms. The light may be ambient light or light from a flash or continuously illuminated lamp or lamps. Alternatively, the light may be polarized or may be structured to illuminate only points of interest on the wafers.

The wafers must have a known diameter and a portion of the circumferential edge of the respective wafers must be viewable by the camera to identify at least three points on the circumference from which the center of the wafers can be computed. The position of the wafers in the cassette is also computed from the edge detection data and from the known position of the cassettes in relation to the camera position.

The system can be used to determine how many wafers are in the cassette, whether any wafers are missing and whether the wafers are properly disposed in their respective slots within the cassette. It can be determined whether any wafers are cross slotted such that they are not parallel stacked as they should be for proper removal and reinsertion into the cassette by a robot or other transfer tool. Image analysis and processing is employed to determine the center of each of the wafers. By determining the center of the wafers, a robot can grip the center of the wafers without need for a separate alignment step or alignment apparatus. One image scan provides a determination of all information on the X, Y and Z position of the wafers in relation to the camera reference position. The rotational position of the wafers about their respective centers is not determined but is not needed for system function.

The imaging system can also be employed to determine the presence and position of other substrates or items of known shape and dimensions. For example, for image processing of a square, rectangle or other multilateral substrate of known size, a corner and two adjacent sides or a side and two adjacent corners can be detected and the resulting data employed to determine the position of the substrates in a storage container.

BRIEF DESCRIPTION OF THE SEVERAL VIEWS OF THE DRAWING

The invention will be more fully described from the following detailed description taken in conjunction with the drawings in which.

DETAILED DESCRIPTION OF THE INVENTION

Figure 1:
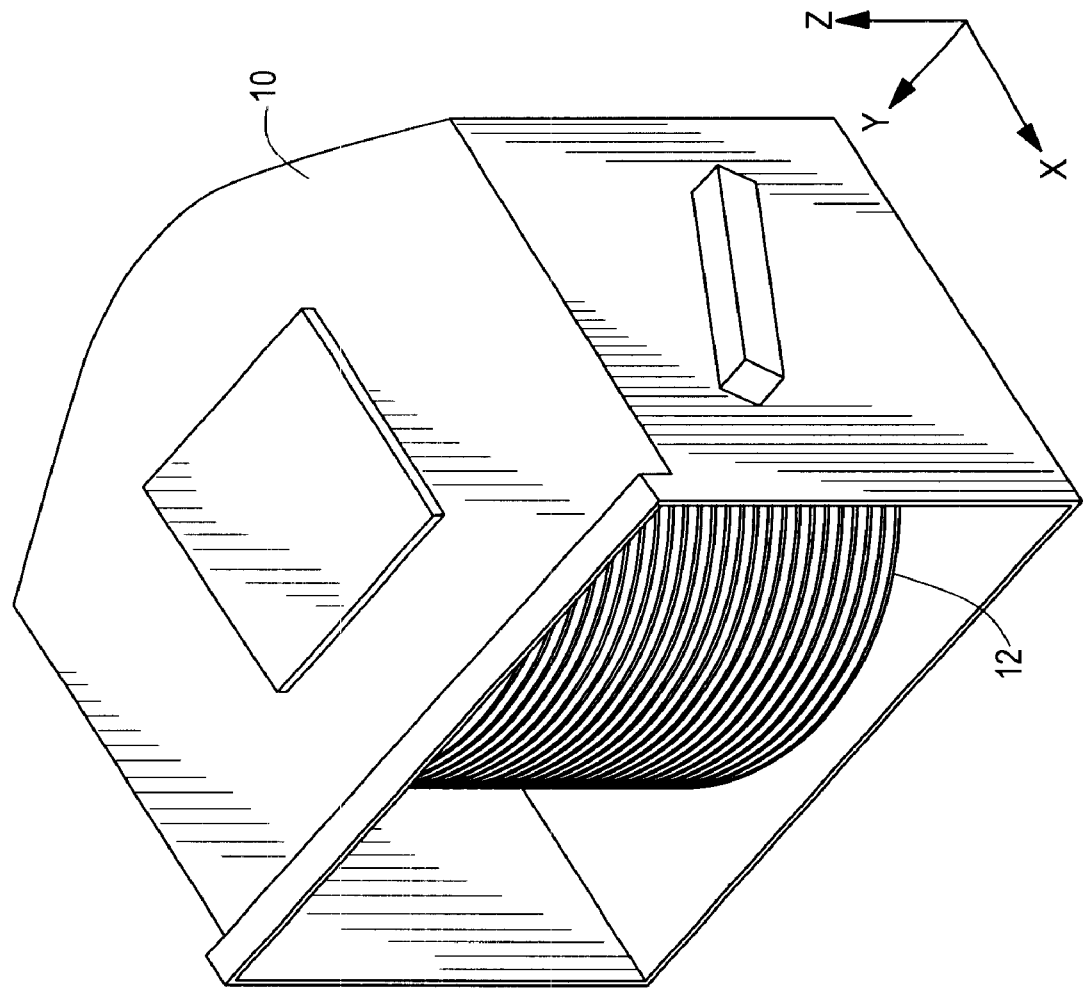
FIG. 1 is a pictorial view of a wafer imaging system in accordance with the invention.
Figure 2:
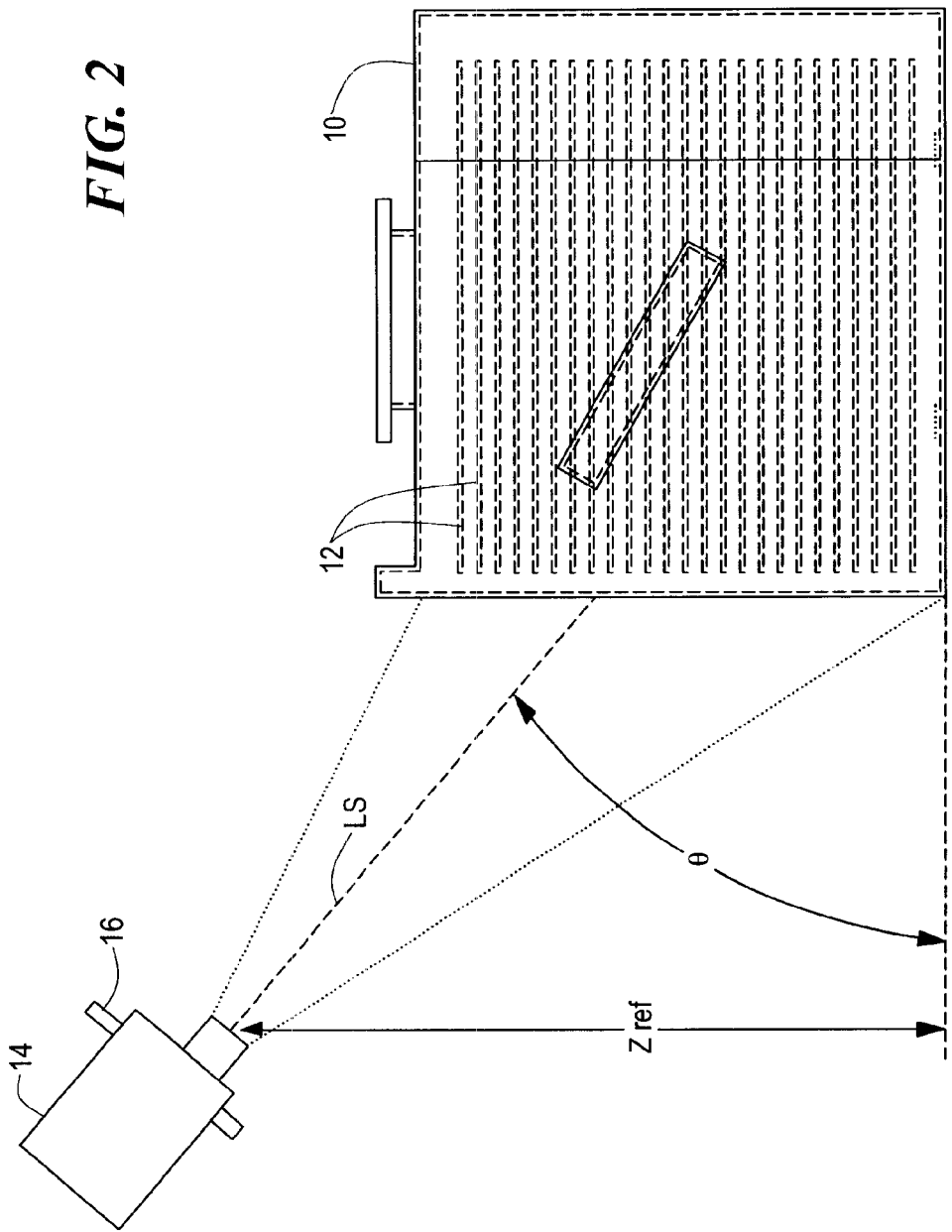
FIG. 2 is a side view of a wafer imaging system in accordance with the invention.

Referring to FIGS. 1 and 2 there is shown in diagrammatic form a cutaway view of a wafer cassette 10 containing a stack of wafers 12 therein. Each of the wafers is disposed within a respective groove in the interior of the cassette and the wafers are spaced in a normally vertical stack as is well known in the industry. The wafers are of a known diameter. A camera 14 is disposed at an angle to the front opening of the cassette 10 in a position to view the edges of the entire stack of wafers 12. The camera can be a digital video camera providing digital signals representative of an image being seen. Alternatively the camera can be of analog type having a solid state optical sensor such as a CCD sensor, or an image tube such as a vidicon tube providing raster scan of an image. The camera is positioned at a known height Zref in relation to the plane on which the cassette is disposed. The line of sight LS of the camera is at an angle θ to that plane to provide a view of a portion of the edges of the full set of wafers within the cassette. The line of sight LS in the illustrated embodiment is about 20° from the horizontal (X) reference surface.

Figure 3:
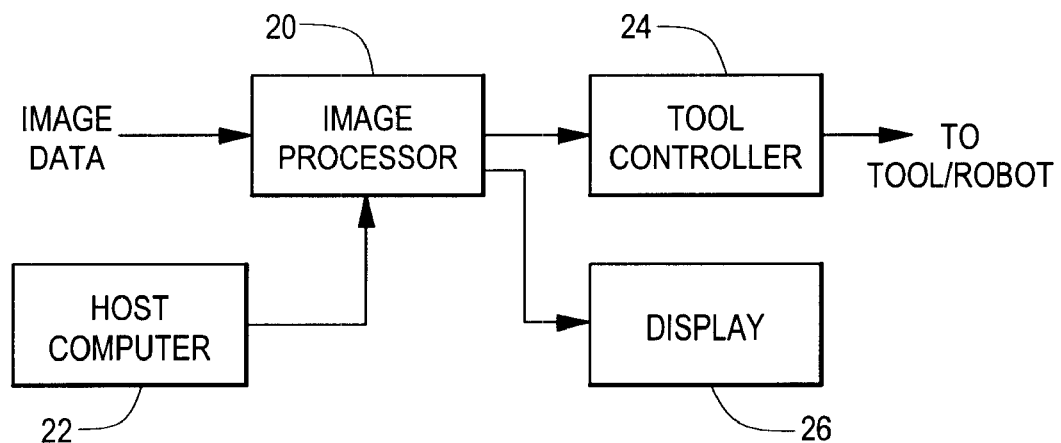
FIG. 3 is a block diagram of an image processing system for providing output information in response to image data.

It should be understood that the cameras can be any type of image sensor or sensor apparatus capable of producing image data of the wafer edges being viewed. At least one frame of image data is captured by the camera for processing by an image processor to provide intended output data. The image data can be provided to the image processor directly from the camera or through intermediate storage buffers or other memory devices. If the camera provides analog output signals, the signals are converted in an analog-to-digital converter to digital form for processing by the image processor. A block diagram of a processing system is shown in FIG. 3. Image data from the camera or from a memory device is provided to an image processor 20 which is operative with a host computer 22 to derive from the received image data information representing intended outputs. The image processor and host computer may be part of a stand-alone, special-purpose image processing computer system. The image processor provides output data representing the position of each wafer within its respective slot location in the cassette, whether or not any wafers are missing, whether or not any wafers are cross-slotted or otherwise misaligned within the cassette, and the center of each of the wafers. All of this information can be provided from a single image scan of the wafers by the camera. The center of each of the wafers is computed from three points on the circumference of each wafer based upon known geometric principles. The techniques of image processing to provide positional information from a scanned image are, per se, known and are not described in detail herein.

The output data from image processor 20 is provided to a tool controller 24 which is operative to control the operation of a tool or robot for gripping and removing wafers from the cassette. The output from image processor 20 can also be applied to a display 26 for numerical or graphic depiction of positional and alignment information.

The ambient light may be sufficient for providing an acceptable image of the wafers. Alternatively, the wafers being viewed by the camera may be illuminated by one or more light sources associated with the camera. A light source 16 may be disposed around the camera as shown to illuminate the wafers, or the light source or sources may be in any other convenient location providing illumination of the wafers at a light level sufficient to provide an acceptable image. The light may be polarized or may be structured. Polarized light may be employed to illuminate reflective wafers in order to enhance the contrast of the image and reduce unwanted reflections. Structured light may be employed to illuminate only those portions of interest on the wafer edges. For example, three beams of light can be used to illuminate three points on the edges of the wafers, and the images of which points are utilized in computing the wafer positions.

It will be appreciated that the invention is not limited to determining the presence, position and/or alignment of semiconductor wafers but is also applicable to determining the presence, position and/or alignment of other circular or disk-like objects stacked within a cassette or other storage enclosure. The invention is further applicable to determining the presence, position and/or alignment of other items of known shape and dimensions. Accordingly, the invention is not to be limited by what has been particularly shown and described but is intended to encompass the full scope and spirit of the appended claims.

What is claimed is:

1. A system for determining the position of semiconductor wafers of known size contained in spaced position within a cassette comprising:

a camera operative to view at least a portion of the circumferential edges of a stack of wafers contained in a cassette to identify at least three points on the circumference of the wafers from which the center of the wafers can be determined, and provide output signals representative of an image of the stack of wafers;

apparatus for mounting the camera in angular relation to the cassette of wafers such that the camera can view a portion of the circumferential edges of the stack of wafers in the cassette;

an image processor operative in response to signals from the camera to provide output data representing one or more missing wafers in the cassette, representing any cross-slotted wafers and representing the center of each of the wafers.

2. The system of claim 1 wherein the camera is a digital camera providing digital output signals.

3. The system of claim 1 wherein the camera is an analog camera providing analog output signals.

4. The system of claim 1 further including a controller responsive to the output data from the image processor to control a tool or robot.

5. The system of claim 1 including a light source to illuminate the wafers.

6. A system for determining the position of semiconductor wafers of known size contained in spaced position within a cassette comprising:

a camera operative to view at least a portion of the edges of a stack of wafers contained in a cassette and provide output signals representative of an image of the stack of wafers;

apparatus for mounting the camera in angular relation to the cassette of wafers such that the camera can view a portion of the edges of the stack of wafers in the cassette;

an image processor operative in response to signals from the camera to provide output data representative of the position and alignment of each of the wafers in the cassette and with respect to known reference positions; and wherein the image processor provides output data representing a cross-slotted wafer.

7. The system of claim 6 wherein the image processor provides output data representing the center of each of the wafers.

* * * * *